United States Patent [19]
Wetters et al.

[11] Patent Number: 5,745,843
[45] Date of Patent: Apr. 28, 1998

[54] SELECTIVE CALL RECEIVERS WITH INTEGER DIVIDE SYNTHESIZERS FOR ACHIEVING FAST-LOCK TIME

[75] Inventors: John David Wetters, Coral Springs; Raul Salvi, Boca Raton, both of Fla.

[73] Assignee: Motorola, Inc., Schaumburg

[21] Appl. No.: 511,159

[22] Filed: Aug. 4, 1995

[51] Int. Cl.$^6$ .................................................. H04B 1/50

[52] U.S. Cl. ........................ 455/76; 455/87; 455/112; 455/113; 455/260; 455/265; 340/825.44; 332/127

[58] Field of Search ................... 455/38.1, 38.2, 455/38.3, 74, 76, 84, 85, 86, 112, 113, 118, 260, 313, 208, 75, 87, 259, 265; 340/825.44; 332/127

[56] References Cited

U.S. PATENT DOCUMENTS

| | | | |
|---|---|---|---|
| 4,755,774 | 7/1988 | Heck | 455/115 X |
| 5,263,197 | 11/1993 | Manjo et al. | 455/324 |
| 5,471,652 | 11/1995 | Hulkko | 455/112 X |
| 5,542,113 | 7/1996 | Fink et al. | 455/76 X |
| 5,606,739 | 2/1997 | Goto | 455/38.3 |

*Primary Examiner*—Reinhard J. Eisenzopf
*Assistant Examiner*—Philip Sobutka
*Attorney, Agent, or Firm*—Keith A. Chanroo

[57] ABSTRACT

A selective call receiver (100) for receiving and transmitting paging signals has a transceiver (104) having an integer divide synthesizer (105) for achieving a fast lock time. The transceiver (104) has a reference oscillator (202) that generates a reference signal in a direct injection path and a modulator (206) coupled in the direct injection path modulates the reference signal to generate a modulated reference signal. A phase locked offset loop (220) coupled to the direct injection path generates a low frequency signal derived from the reference signal, a multiplier (210) coupled to the modulator (206) multiplies the modulated reference signal, and a mixer (214) coupled to the multiplier (210) receives the modulated reference signal in the direct injection path and an output signal from the phase locked offset loop (220) to generate a first local oscillator output signal and a modulated transmit carrier.

9 Claims, 2 Drawing Sheets

SELECTIVE CALL RECEIVERS WITH INTEGER DIVIDE SYNTHESIZERS FOR ACHIEVING FAST-LOCK TIME

FIELD OF THE INVENTION

This invention relates in general to selective call receivers and more particularly to an integer divide synthesizer for achieving fast lock time.

BACKGROUND OF THE INVENTION

Paging technology has evolved from one-way paging where the selective call receiver (or pager) only receives pages to two-way paging where the selective call receiver receives pages and transmits responses thereto. A two-way selective call receiver is commonly referred to as an acknowledge-back (or ack-back) pager because the pager is able to transmit an acknowledgment in response to the receipt of a page.

The two-way selective call receiver or ack-back pager uses an integrated circuit (IC) frequency synthesizer, the operation of which is well known to one of ordinary skill in the art. Presently, the frequency synthesizer uses a direct fractional divide phase-lock-loop (PLL) which has a high current drain.

However, because selective call receivers are portable devices that have limited energy content battery, it is desirable to have low current devices to minimize the current drain of the battery of the selective call receiver. Additionally, a current integer divide frequency synthesizer exhibits long lock time which lowers the throughput of the message system and lower battery life since the strobe and power-up sequences are lengthened. Also, modulation of an integer divide frequency synthesizer is accomplished by a two-spot modulator which exhibits several undesirable features such as: a) high deviation distortion at the cross-over frequency, b) modulation imbalance requiring the use of an external potentiometer at the high and low ports to maintain a balance, c) buffering between the high and low ports are required and d) an external digital-to-analog converter (DAC) and a varactor are required to apply the modulated signal to the reference oscillator and the voltage controlled oscillator (VCO).

Also, with the advent of digital transmission, the selective call receiver uses a digital signal processor (DSP) which has a clock signal that has to obtain synchronization with the incoming data.

DESCRIPTION OF A PREFERRED EMBODIMENT

Figure 1:
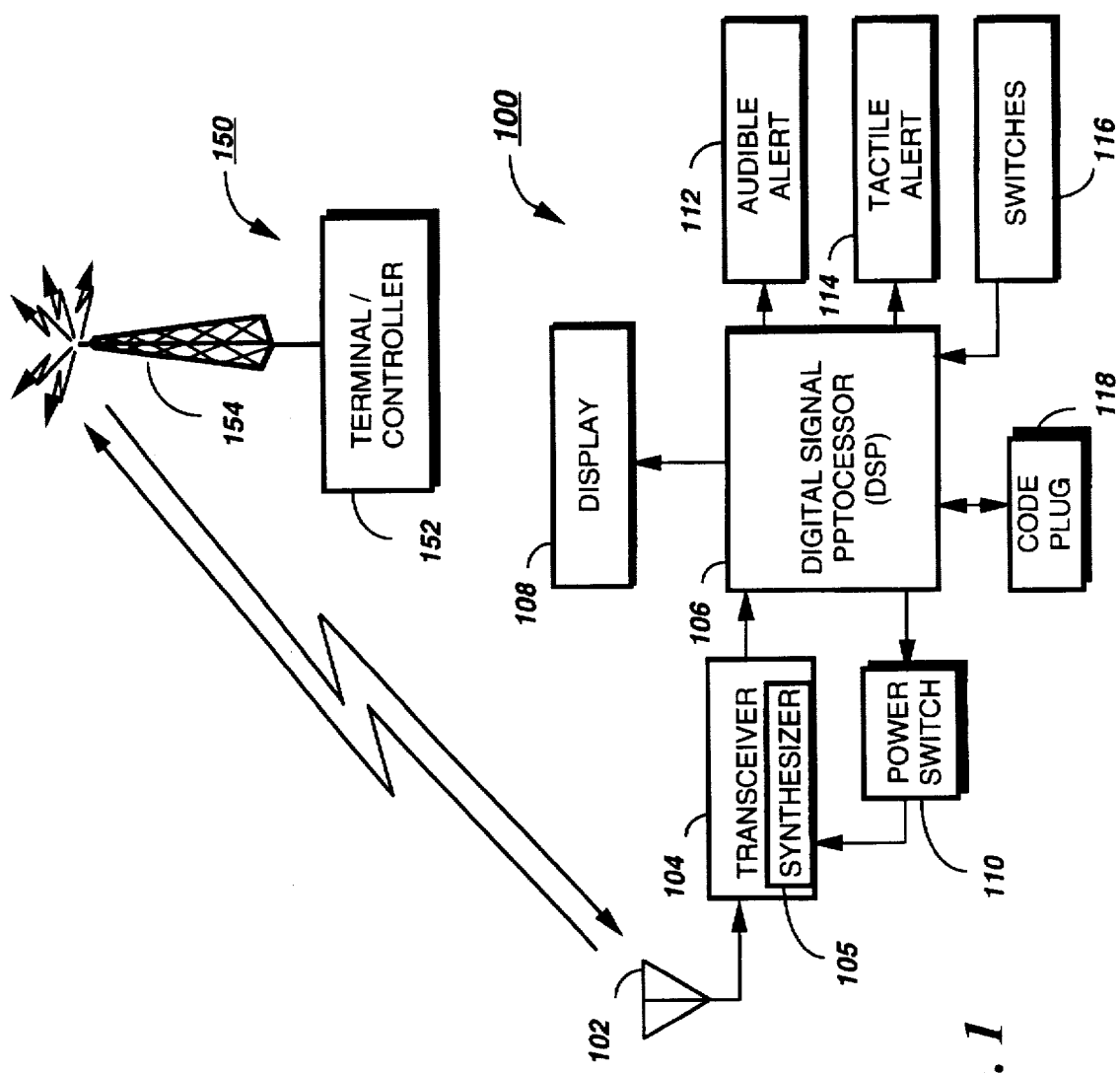
FIG. 1 is an electrical block diagram of a selective call receiver utilizing a transceiver having integer divide frequency synthesizer in accordance with a preferred embodiment of the present invention.

A transceiver 104, as shown in FIG. 1, has an integer divide frequency synthesizer 105 to be discussed below, the transceiver 104 and the synthesizer 105 are included in a selective call receiver 100 which operates in the selective call system 10 according to the preferred embodiment of the present invention. A selective call network 150 forms a part of the selective call system 10 comprising a paging terminal controller 152 which receives messages or pages from an input device, for example a telephone, computer or an alpha-entry device or the like (not shown). The received message or information is processed by encoding the message destined for a selective call receiver with an address. The encoded message is then passed to an antenna 154 which transmits and receives radio frequency (RF) information to and from a communication device, for example the selective call receiver 100.

The selective call receiver 100 (e.g., a pager) comprises an antenna 102 that provides an RF carrier signal to the transceiver 104 which operates as a receiver and a transmitter. The RF signal is mixed with a local oscillator signal contained within the synthesizer 105 of the transceiver 104. The transceiver 104, in the receiving mode, generates a recovered signal suitable for processing by a digital signal processor ("DSP") 106 in a manner well known to one of ordinary skill in the art. The DSP performs function such as encoding and decoding messages and controlling the operation of the selective call receiver 100 well known to one of ordinary skilled in the art. The DSP 106 processes the received signal to decode the address and compares the decoded address with one or more predetermined addresses contained in a memory, for example, a codeplug 118. When the addresses are substantially similar, the user is alerted that a signal has been received either by an audio alert (e.g., a speaker or transducer) 112 or a tactile alert (e.g., a vibrator) 114. The received signal may also include optional message data directed to some selective call receivers. Also, if the selective call receiver 100 includes an optional voice output, recovered audio components of the received RF signal may be presented. For a message selective call receiver, the recovered message is stored in the memory 118 for subsequent presentation by an output device which for example is a display 108. The output device will automatically, or when manually selected by switches 116, present the message, such as by displaying the message on the display 108.

For an acknowledge-back selective call receiver (two-way pager), a signal may be transmitted either automatically or manually in response to the receipt of a paging message (or signal) by the selective call receiver 100. The user, in the case of a manual response, uses the switches 116 to select a message from, for example, one of a number of prestored message from memory to be sent to the originator. The message is then encoded by the DSP 106 and passed to the transceiver 104 for transmission by the antenna 102.

Figure 2:
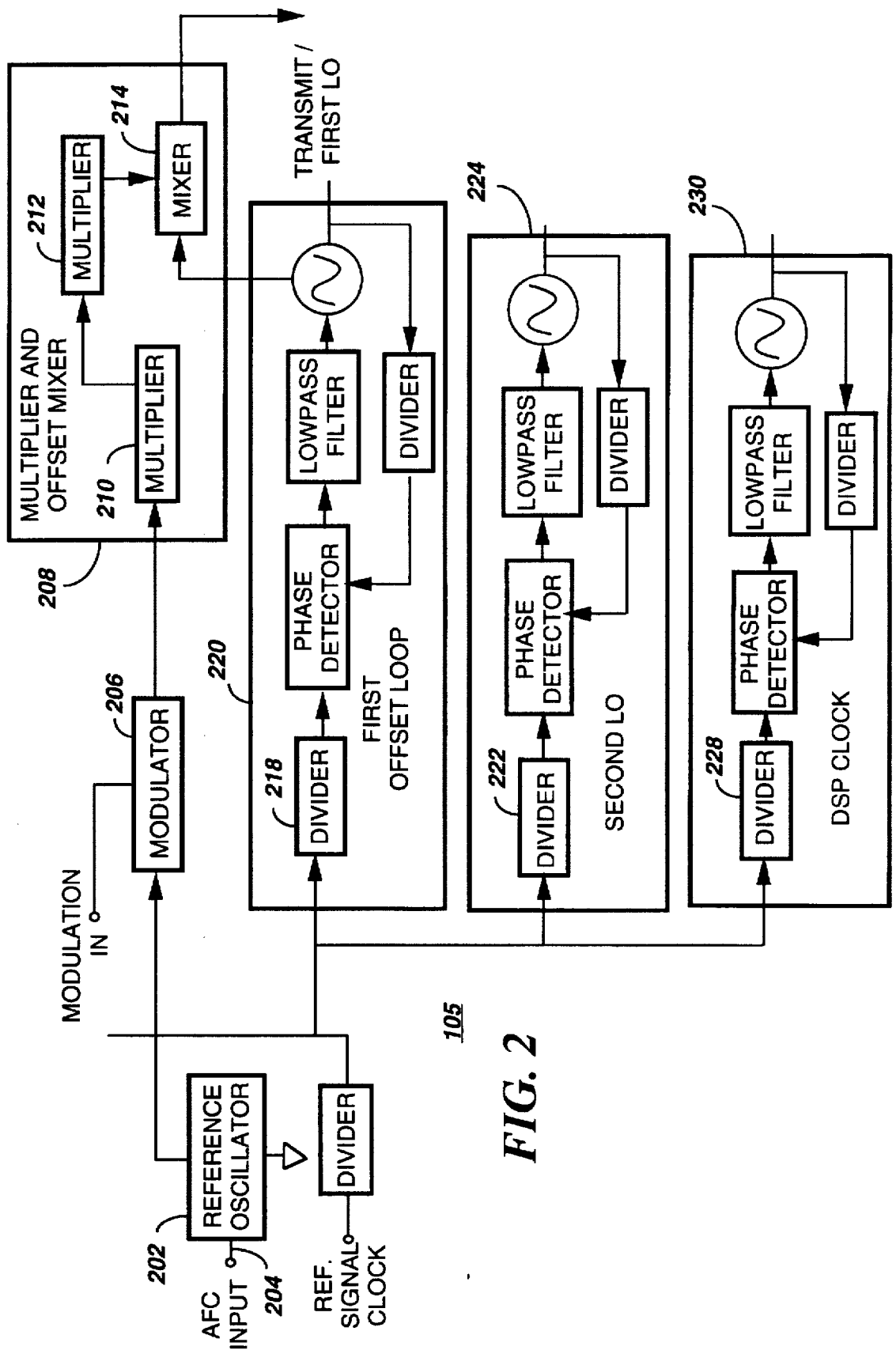
FIG. 2 is an electrical block diagram illustrating the details of the frequency synthesizer in accordance with the preferred embodiment of the present invention.

Referring to FIG. 2, a detailed electrical block diagram of the integer divide synthesizer is shown according to the preferred embodiment of the present invention. The frequency synthesizer 105 is preferably a low frequency integer divided synthesizer which includes a reference oscillator 202 operating preferably at 76.8 MHz frequency which generates a low frequency reference signal or a time base (or clock) signal for the entire selective call receiver 100 in a direct injection path. The reference oscillator 202 includes an automatic frequency control (AFC) input 204 controlled by the DSP 106 to generate the reference signal. A modulator 206 is coupled to the reference oscillator 202, the modulator is preferably a frequency-shift-keyed (FSK) modulator. The FSK modulator modulates the 76.8 MHz reference oscillator signal with the transmit data on a direct path before the signal is multiplied and mixed. The reference oscillator 202, the modulator 206, the multiplier 210 and the offset loop 208 form the direct injection path to generate the 896–902 MHz signal which comprises a modulated transmit carrier signal. Since the signal is modulated outside the synthesizer loop, only a one-port modulator is needed which results in low distortion and eliminates the need to balance as required with a two port modulator. The FSK modulator is on only during the transmit mode which minimizes the current drain on the battery of the selective call receiver 100.

A multiplier and an offset mixer 208 are coupled to the modulator 206. The multiplier and offset mixer 208 comprise two multipliers 210, 212 and a mixer 214. The multipliers 210, 212 preferably comprise 8 times multiplier constants operating at a frequency of 900 MHz to up-convert the 76.8 MHz signal by multiplying the 76.8 MHz by eight to achieve an 614.4 MHz signal. The 614.4 MHz signal is then passed to the mixer 214 which preferably comprises a Gilbert cell mixer. The Gilbert cell mixer 214 mixes the 614.4 MHz signal with a first offset loop signal to generate an output signal within a range of 879.4 MHz to 902 MHz signal which is then fed into a first mixer local oscillator (LO) of the transceiver (not shown).

A first offset loop 220 couples an output of the unmodulated signal from the reference oscillator 202 by divider 218 which is preferably a programmable divider preferably having a divisor of 12 and 288. The programmable divider 218 causes the first offset loop 220 to be a programmable offset loop 220 which comprises a phase detector, a lowpass filter and a voltage controlled oscillator (VCO) coupled in parallel with a divider to produce a low frequency offset loop signal in the range of 265 MHz to 287.6 MHz for generating a fast lock time signal. This fast lock time signal represents a band switchable low lock time signal which is mixed by the Gilbert cell mixer 214 as described above and is capable of switching between at least two frequencies. The first offset loop 220 along with a second offset loop 224 and an DSP clock loop 230 use a low current integer divide phase lock loop (PLL) for low current drain operation. The first offset loop 220 generates a fast lock time offset loop signal in the frequency range of 265 to 287.6 MHz, the lock time of which is a relatively low frequency signal with a tunable bandwidth that is sufficiently wide to ensure that all frequencies within the frequency range are received.

A second offset loop (LO) 224 similar to the first offset loop 220 is coupled to the output of the reference oscillator and a divide-by-600 programmable divider 222. The second LO 224 comprises a phase detector, a lowpass filter and a VCO which are coupled in parallel with a programmable divider to produce a low current drain feed back loop signal in the range of 49.6 MHz plus-or minus 192 KHz. This signal is phase locked to the reference oscillator 202 by an integer divide PLL. The DSP clock loop 230 is also coupled to the reference oscillator from a programmable divider 228 which has a divisor of 2000. The DSP clock loop 230 comprises a phase detector, a lowpass filter and a VCO which are coupled in parallel with a programmable divider to produce an DSP signal in the range of 38.4 KHz. This signal can be switched programmatically as required and can be phased synchronized to the reference oscillator 202 which is important for reception of digital signaling. In another embodiment, a divide-by-25 divider can be used to supply a clock for intermediate frequency (IF) sampling.

A reference clock signal is generated as a divide down version of the reference oscillator signal. The reference clock signal is used as a clock signal (time base signal) for other on-board integrated circuits. Accordingly, a fast lock time loop low current operation is achieved having an DSP clock which is phased locked to the high stability reference by deriving the DSP signal from the reference signal to generate an agile high frequency first LO. Similarly, the transceiver transmit first LO and second LO sources are phase locked to the same high stability reference signal. To minimize the current drain, the modulator is turned-off in non acknowledge-back mode of operation. Additionally, no external balance trimming of components are necessary as is required for a dual mode PLL modulator, and the synthesizer can be integrated into a single integrate circuit (IC) chip.

In summary, a selective call receiver for receiving and transmitting paging signals is described which comprises a transceiver that has an integer divide synthesizer for achieving a fast lock time. The transceiver comprises a reference oscillator that generates a reference signal in a direct injection path and a modulator coupled in the direct injection path to modulate the reference signal to generate a modulated reference signal. A phase locked offset loop coupled to the direct injection path generates a low frequency signal derived from the reference signal, a multiplier coupled to the modulator multiplies the modulated reference signal, and a mixer coupled to the multiplier receives the modulated reference signal in the direct injection path and an output signal from the phase locked offset loop to generate a first local oscillator output signal and a modulated transmit carrier signal.

We claim:

1. A selective call receiver for receiving and transmitting paging signals, comprising:

a transceiver having an integer divide synthesizer for achieving a fast lock time, the transceiver comprising:

a reference oscillator for generating a low frequency reference signal in a direct injection path for deriving a time base signal;

a modulator coupled in the direct injection path for modulating the low frequency reference signal to generate a modulated reference signal;

a phase locked offset loop coupled to the direct injection path for dividing the time base signal to a low frequency signal derived from the reference signal to generate a fast lock time offset loop signal, the phase locked loop further comprises an integer divider that generates a low current drain feed back loop signal;

a multiplier coupled to the modulator for multiplying the modulated reference signal; and a mixer coupled to the multiplier for receiving the modulated reference signal in the direct injection path and an output signal from the phase locked offset loop to generate an agile high frequency first local oscillator output signal and a modulated transmit carrier.

2. The selective call receiver according to claim 1 wherein the phase locked offset loop generates the low frequency signal derived from the reference signal before the reference signal is modulated.

3. The selective call receiver according to claim 1 wherein the phase locked offset loop comprises a programmable divider for switching between at least two frequencies.

4. An integer divide synthesizer for achieving a fast lock time, comprising:

a reference oscillator for generating a low frequency reference signal in a direct injection path for deriving a time base signal;

a modulator coupled in the direct injection path for modulating the low frequency reference signal to generate a modulated reference signal;

a phase locked offset loop coupled to the direct injection path for dividing the time base signal to a low frequency signal derived from the reference signal to generate a fast lock time offset loop signal, the phase locked loop further comprises an integer divider that generates a low current drain feed back loop signal;

a multiplier coupled to the modulator for multiplying the modulated reference signal; and a mixer coupled to the multiplier for receiving the modulated reference signal in the direct injection path and an output signal from the phase locked offset loop for generating an agile high frequency first local oscillator output signal and a modulated transmit carrier.

5. The low frequency integer divide synthesizer according to claim 4 wherein the phase locked offset loop generates the low frequency signal derived from the reference signal before the reference signal is modulated.

6. The low frequency integer divide synthesizer according to claim 4 wherein the phase locked offset loop comprises a programmable divider for switching between at least two frequencies.

7. A transceiver for receiving and transmitting a signal, comprising:

a programmable offset loop for switching an unmodulated signal between at least two frequencies, the programmable offset loop comprises:

a low current integer divide PLL coupled to a reference oscillator signal;

an integer divide synthesizer for achieving a fast lock time comprising a reference oscillator for generating a low frequency reference signal in a direct injection path for deriving a time base signal;

a modulator coupled in the direct injection path for modulating the low frequency reference signal to generated a modulated reference signal;

a phase locked offset loop coupled to the direct injection path for dividing the time base signal to a signal derived from the reference signal to generate a fast lock time offset loop signal, the phase locked loop further comprises an integer divider that generates a low current drain feed back loop signal;

a multiplier coupled to the modulator for multiplying the modulated reference signal; and a mixer coupled to the multiplier receiving the modulated reference signal in the direct injection path and an output signal from the phase locked offset loop to generate an agile high frequency first local oscillator output signal.

8. In transceiver, a method for obtaining a fast lock time signal, comprising the steps of:

generating a low frequency reference signal for deriving a time base signal;

dividing the time base signal;

modulating the low frequency reference signal for generating a modulated reference signal;

multiplying the modulated reference signal;

dividing the time base signal to a low frequency offset loop signal for generating a fast lock time offset loop signal;

generating a low current drain feed back loop signal with a phase lock loop having an integer divider; and mixing the modulated reference signal with the low frequency offset loop signal for generating an agile high frequency first local oscillator and modulated transmit signal.

9. The method according to claim 8 wherein the step of dividing the time base signal further comprising dividing the time base signal to generate at least an DSP clock loop.

* * * * *